United States Patent
Choi et al.

(10) Patent No.: US 7,180,808 B2
(45) Date of Patent: Feb. 20, 2007

(54) SEMICONDUCTOR MEMORY DEVICE FOR PERFORMING REFRESH OPERATION

(75) Inventors: Jong-Hyun Choi, Gyeonggi-do (KR); Dong-Il Seo, Gyeonggi-do (KR); Young-Hun Seo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/954,530

(22) Filed: Sep. 29, 2004

(65) Prior Publication Data
US 2005/0105362 A1    May 19, 2005

(30) Foreign Application Priority Data
Nov. 14, 2003  (KR) ...................... 10-2003-0080688

(51) Int. Cl.
*G11C 7/00* (2006.01)
*G11C 8/00* (2006.01)

(52) U.S. Cl. ...................... 365/222; 365/233
(58) Field of Classification Search ........... 365/222, 365/189.12, 230.03, 233, 240
See application file for complete search history.

(56) References Cited

U.S. PATENT DOCUMENTS

| | | | |
|---|---|---|---|
| 5,742,554 A * | 4/1998 | Fujioka | 365/230.03 |
| 6,154,417 A * | 11/2000 | Kim | 365/233 |
| 6,275,895 B1 * | 8/2001 | Tabo | 365/222 |
| 6,859,407 B1 * | 2/2005 | Suh | 365/222 |
| 6,992,943 B2 * | 1/2006 | Hwang et al. | 365/222 |
| 2002/0191466 A1 | 12/2002 | Hwang et al. | |

FOREIGN PATENT DOCUMENTS

| | | |
|---|---|---|
| KR | 2000-52491 | 8/2000 |
| KR | 1020020074723 | 4/2002 |
| KR | 2002-72020 | 9/2002 |
| KR | 1020030025322 | 3/2003 |

OTHER PUBLICATIONS

English language abstract of Korean Publication No. 1020030025322.
English language abstract of Korean Publication No. 1020020074723.
English language abstract of Korean Publication No. 2000-52491.
English language abstract of Korean Publication No. 2002-72020.

* cited by examiner

*Primary Examiner*—Trong Phan
(74) *Attorney, Agent, or Firm*—Marger Johnson & McCollom, P.C.

(57) ABSTRACT

A memory device according to the present invention includes multiple refresh modes and a refresh controller. A first refresh mode can respectively select one more memory block among a plurality of banks comprising a plurality of blocks and each of all banks. In addition, the first refresh mode may perform a refresh operation with respect to selected memory blocks. The second refresh mode can select a part of the banks and perform a refresh operation of data with a selected bank. The controller may select one of the first and second refresh modes in a refresh operation.

21 Claims, 5 Drawing Sheets

SEMICONDUCTOR MEMORY DEVICE FOR PERFORMING REFRESH OPERATION

This application claims priority from Korean Patent Application No. 2003-80688, filed on Nov. 14, 2003, the contents of which are herein incorporated by reference in their entirety.

FIELD OF THE INVENTION

This disclosure generally relates to semiconductor memory devices and, more specifically, to a semiconductor memory device such as a Dynamic Random Access Memory (DRAM) and a refresh operation.

BACKGROUND OF THE INVENTION

Semiconductor memory devices are generally categorized as Dynamic Random Access Memory (DRAM) or Static Random Access Memory (SRAM) depending on a method of maintaining stored data.

A basic memory cell in an SRAM comprises a flip-flop circuit. SRAM is considered reliable for data storage. By comparison, a DRAM comprises a capacitor as a basic memory cell. Unfortunately, charges of capacitors gradually discharge by leakage current. Accordingly, DRAM must be recharged to preserve data stored in its cells. This recharging operation is referred to as a refresh. In a refresh operation, data stored in a cell is read and amplified, and then restored in the cell.

FIG. 1 is a block diagram of a conventional semiconductor device for performing a refresh operation. Referring to FIG. 1, the conventional semiconductor device for the refresh operation comprises a memory unit 100, a bank selector 120 and a refresh controller 130.

Conventionally, a memory unit 100 includes a memory cell array 102, a row decoder 104, a column decoder 106 and a sense amplifier 108. The memory cell array 102 contains memory cells which are arranged by a plurality of rows and columns. The row decoder 104 selects and activates a word line (a row address) of each of the memory cells. The column decoder 106 selects and activates a bit line (a column address) of each of the memory cells. The sense amplifier 108 then amplifies data (charges) of a cell (a capacitor). The data is transferred by a bit line and then restored in the cell, thereby performing a refresh operation. In most semiconductor memory devices, the memory cell array 102 is structured by a plurality of banks (as a matter of convenience, assume four banks). Each bank may have a row and column decoder.

To perform a refresh operation, the bank selector 120 selects one bank among a plurality of banks, thus enabling a row decoder of a selected bank and disabling other row decoders.

If a refresh command is received, the refresh controller 130 sequentially generates row addresses depending on a predetermined clock signal CLK and then inputs them to row decoders connected to each of the banks. The CLK signal may be activated or deactivated at the internal clock controller by a clock enable (CKE) signal. At this time, whether the refresh command is input is sensed by a combination of a chip selection signal /CS, a column address strobe signal /CAS, a row address strobe signal /RAS and a write enable signal /WE.

In a refresh operation for the conventional memory device above, if the refresh command is applied from an external device, a bank may perform the refresh operation to enable an applicable row decoder. In addition, in the refresh controller 130, a row address is sequentially generated according to the refresh command and input to the row decoder. Only word line equivalent to an enabled row decoder becomes sequentially activated by the row address from the refresh controller 130.

If an activated word line is recharged to a certain electric potential, data from all cells connected to the word line is transferred through the bit line to the sense amplifier 108. The sense amplifier 108 may therefore amplify the data and restore it in the original cell(s). As a result, the refresh operation is performed.

A recent data storage method improves the operation speed of semiconductor memories. According to the method, data is stored at a block unit instead of a bank unit. That is, each bank is divided into a plurality of blocks, and data is dispersed and stored in each of the blocks. This happens because as data is stored or read, changing a word line about one bank is still faster than activating a bank.

SUMMARY OF THE INVENTION

The present invention provides a semiconductor memory device capable of performing a refresh operation either for portions of banks (blocks) or for entire banks, according to a mode selection. According to an embodiment of the present invention, a semiconductor memory device for performing a refresh operation includes a refresh controller operated in one of a first and a second refresh mode. The first refresh mode may respectively select a specific block from a plurality of banks and refresh each bank accordingly. The second refresh mode may perform a refresh operation with respect to all blocks of a selected bank or banks.

BRIEF DESCRIPTION OF THE DRAWINGS

FIG. 4A illustrates an embodiment of a refresh region selected in a first refresh mode, and FIG. 4B illustrates an embodiment of a refresh region selected in a second refresh operation.

DETAILED DESCRIPTION OF THE PREFERRED EMBODIMENT

The present invention will be described more fully hereinafter with reference to the accompanying drawings, in which exemplary embodiments of the invention are shown.

Figure 1:
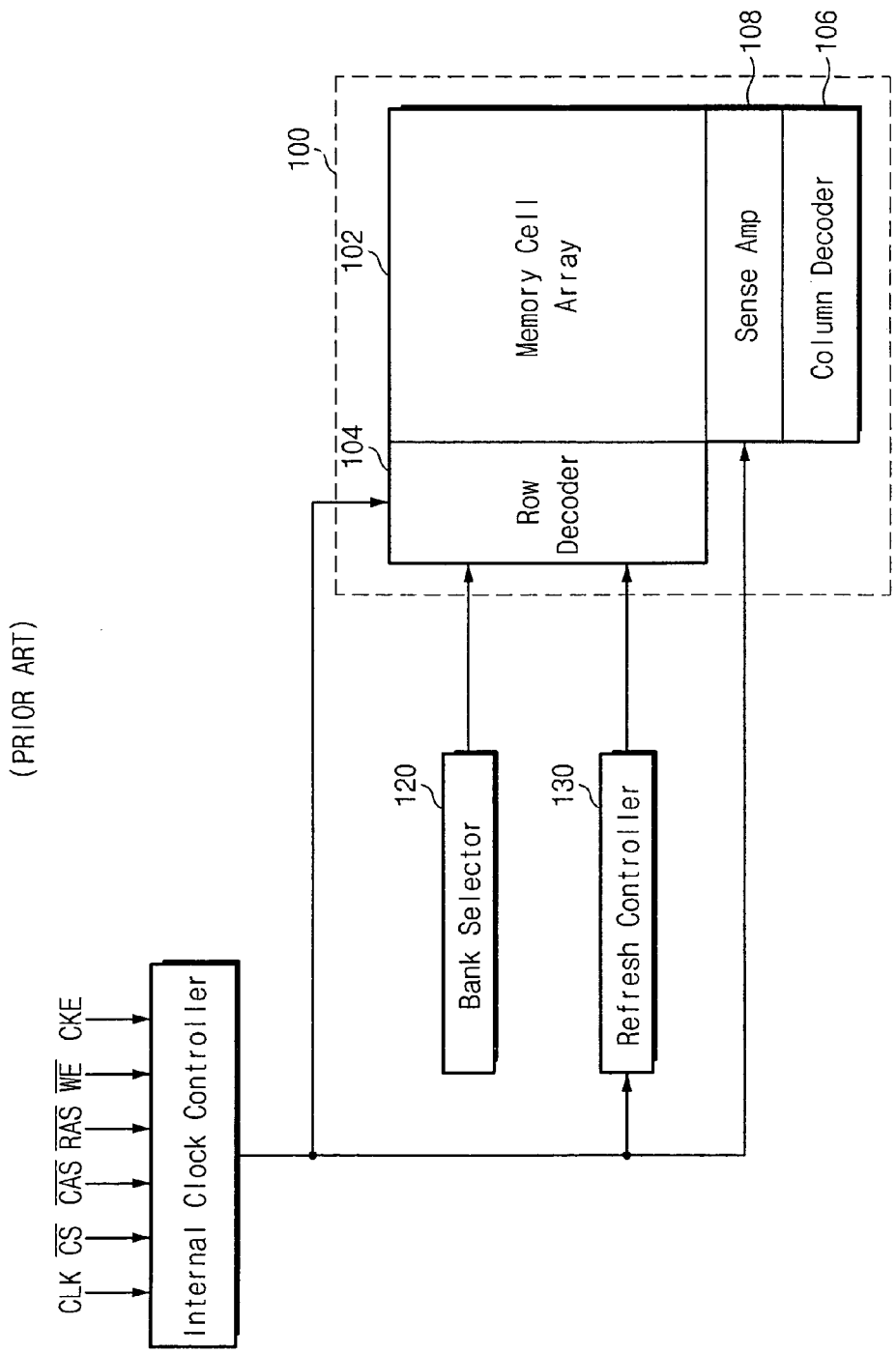
FIG. 1 is a block diagram of a conventional semiconductor memory device for performing a refresh operation by a bank unit.
Figure 2:
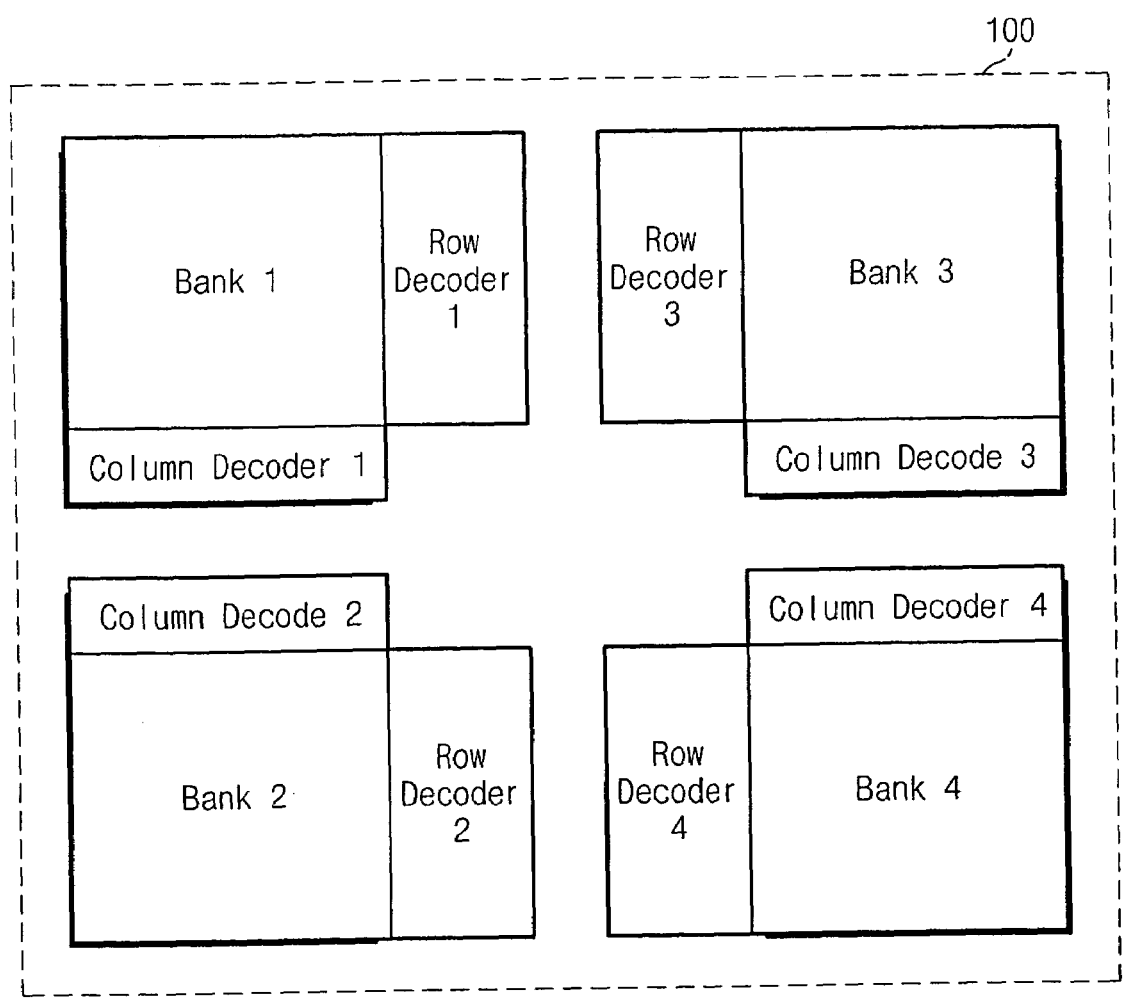
FIG. 2 is a block diagram of a memory having a plurality of banks.

FIG. 2 is a circuit diagram including multiple banks similar to memory cell array 102 and attached row and column decoder circuitry.

Figure 3:
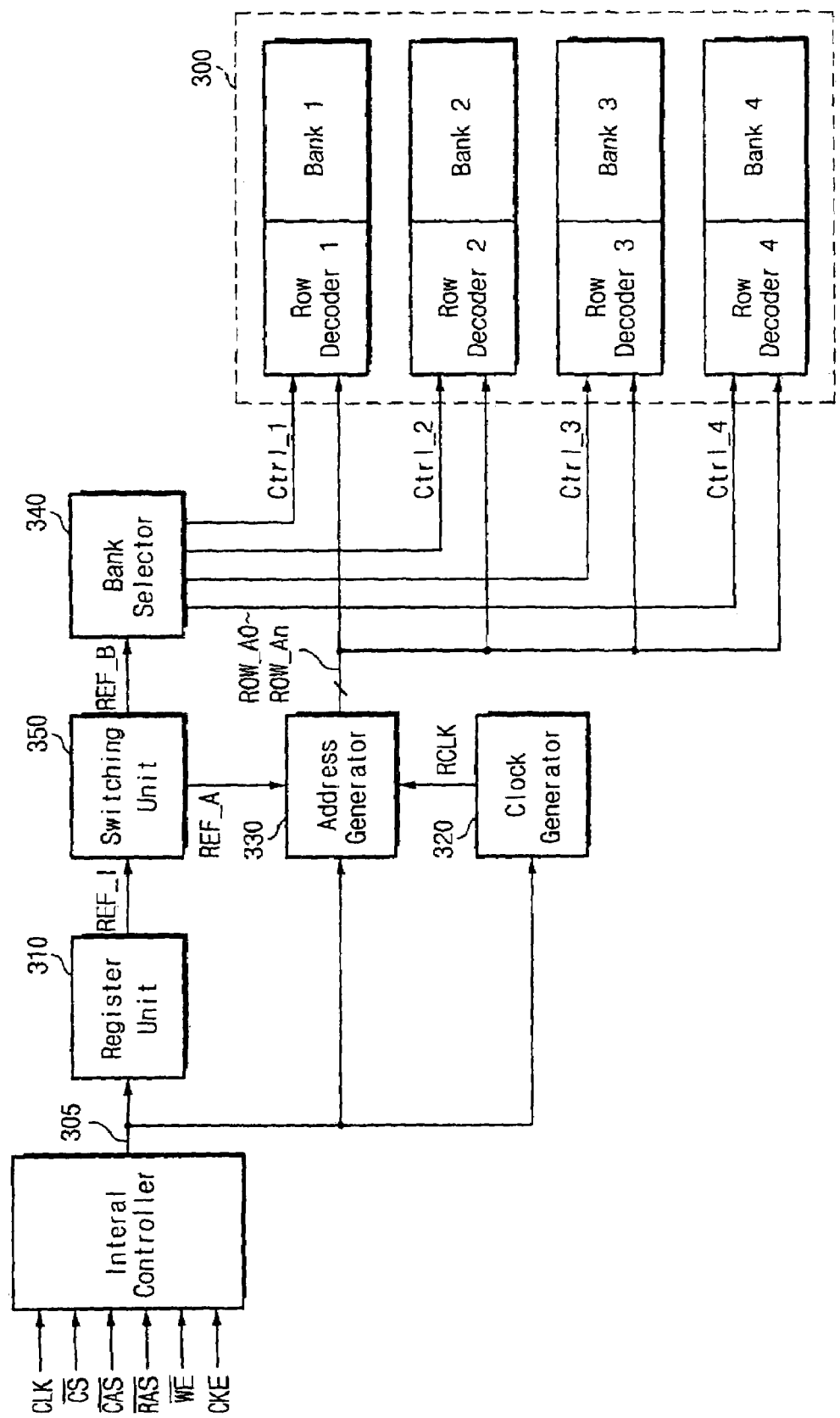
FIG. 3 is a circuit diagram showing an embodiment a semiconductor memory device for refreshing a specific block from each of a plurality of banks or for refreshing according to bank units.

FIG. 3 is a circuit diagram showing an embodiment semiconductor memory device for refreshing a specific block from each of a plurality of banks or for refreshing a bank or group of banks.

The semiconductor memory device shown in FIG. 3 may have two selectable refresh modes. For example, the memory device may have a first refresh mode and a second refresh mode. The first refresh mode can select a specific block from each of a plurality of banks to refresh. The second refresh mode may perform the refresh operation according to bank units. Other embodiments may contemplate more than two modes.

A memory device having these two refresh modes may comprise a memory unit 300 and a register unit 310, a clock generator 320, an address generator 330, a bank selector 340 and a switching unit 350. The memory unit 300 may further include banks (for example, bank 1 through bank 4) including a plurality of blocks, control signals (Ctrl 1 to Ctrl 4), and row decoders 1–4 connected to each bank. CLK and CKE signals are similar to those already described above.

The register unit 310 may store refresh information REF_1 of data stored in banks, for example, refresh bank information REF_B, refresh block information REF_A and refresh mode information. Lines 305 may carry signals such as refresh information and refresh commands.

The clock generator 320 generates a sync clock RCLK for performing a refresh operation according to a refresh command.

In an embodiment, in response to a refresh command, the address generator 330 sequentially generates row addresses ROW_A0~ROW_An. The refresh may be performed according to the sync clock RCLK from the clock generator 320. In this case, the row addresses ROW_A0~ROW_An generated from the address generator 330 depend on refresh mode. That is, in a first refresh mode for performing a refresh operation with respect to a specific block of a bank, only low addresses corresponding to an applicable block are generated. In a second refresh mode for performing a refresh operation by a bank unit, row addresses equivalent to word lines included in the bank may be sequentially generated.

In the present embodiment, the bank selector 340 selects a bank, which performs a refresh operation according to the refresh bank information REF_B and enables a row decoder corresponding to a selected bank. As mentioned above, the refresh operation is performed with respect to all banks in the first refresh mode so that the bank selector 340 selects all banks without any conditions. In addition, banks may be partially or wholly selected depending on the refresh bank information REF_B in the second refresh mode.

The switching unit 350 can transfer the refresh bank information REF_B to the bank selector 340 in accordance with the refresh mode information. In addition, the switching unit 350 may transfer the refresh block information REF_A to the address generator 330 or cut off the connection of the register unit 310 and the address generator 330. This is allowed because refresh block information REF_A is not required in the second refresh mode.

Figure 4A:
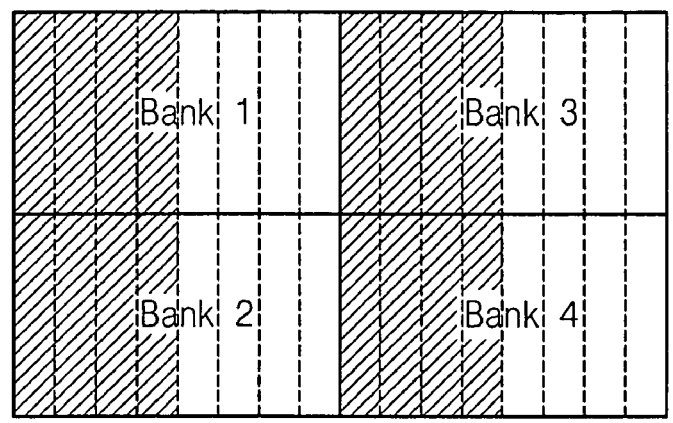
FIGS. 4A and 4B show a refresh region selected by a refresh operation by two refresh modes, each refresh mode operating at ½ (Half) refresh.
Figure 4B:
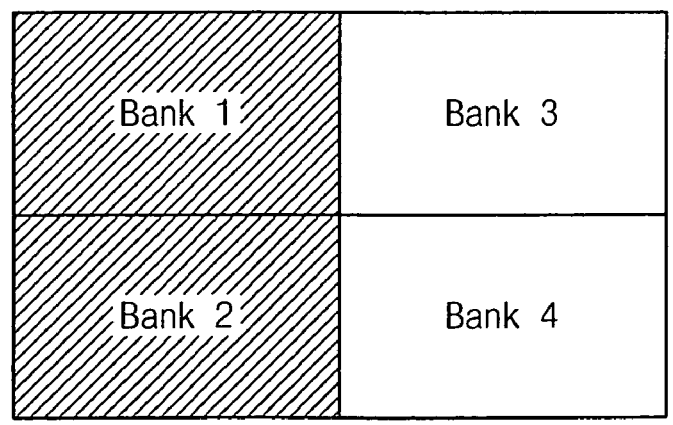

FIGS. 4A and 4B show a refresh region selected in the refresh operation by each refresh mode ½ (Half) in a semiconductor memory device such as shown in FIG. 3. FIG. 4A shows a refresh region selected in a first refresh mode, and FIG. 4B illustrates a refresh region selected in a second refresh operation.

FIG. 4A and FIG. 4B therefore clearly illustrate different refresh modes. More particularly, FIG. 4A shows refreshing the same blocks in a series of banks, while FIG. 4B shows refreshing some banks in a series of banks. The examples shown in FIG. 4A and FIG. 4B each show a ½ refresh operation.

Referring to FIG. 3, FIGS. 4A and 4B, mode information may dictate procedure, for example, to set up a ½ refresh operation while also using the first refresh mode. This may be set up in many ways, examples include in a mode register set (MRS) 306, often set beforehand, or by a fuse option 307. The MRS 306 setting or the fuse 307 setting may be in register unit 310 or other hardware. If the mode information is set to a first refresh mode, the switching unit 350 may transfer refresh block information REF_A from the register unit 310 to the address generator 330. Also, the switching unit 350 may transfer the refresh bank information REF_B for enabling row decoders of all banks to the bank selector 340. The address generator 330 then can sequentially generate row addresses corresponding to the refresh block information REF_A that is, being equivalent to ½ region of the bank, and then input them into the row decoders. Since row decoders are enabled by the bank selector 340, a half of word lines corresponding to an input row address become activated in all banks at the same time, and a refresh operation is operated with respect to each activated word line.

Refresh block information REF_A may be represented employing a unit of an address. For example, as shown in FIG. 4A, if one bank is divided into eight blocks, the block divisions may be represented by a 2-bit sequence (for example, of an address). In other words, all bank (FULL) and ½ (Half), ¼ (Quarter) and ⅛ (Octal) can be represented or selected by the various combinations of 2-bits.

An embodiment using the second refresh mode may also use a ½ refresh operation, also represented with mode information. Depending on mode information, the switching unit 350 may cut off the connection of the register unit 310 and the address generator 330, and input refresh bank information REF_B for performing a refresh operation to bank selector 340. If the refresh operation is performed with respect to only bank 1 and bank 2 in the second refresh mode as shown in FIG. 4B, then the address generator 330 may sequentially generate row addresses being equivalent to all word lines of the bank, according to the sync clock RCLK, from the clock generator 320, and then input them to the row decoders. Additionally, the bank selector 340 may enable row decoders, for example, row decoder 1 and row decoder 2, which are connected to bank 1 and bank 2, and disable the rest of row decoders (in this example row decoder 3 and row decoder 4), and thereby refresh bank 1 and the bank 2.

Figure 5:
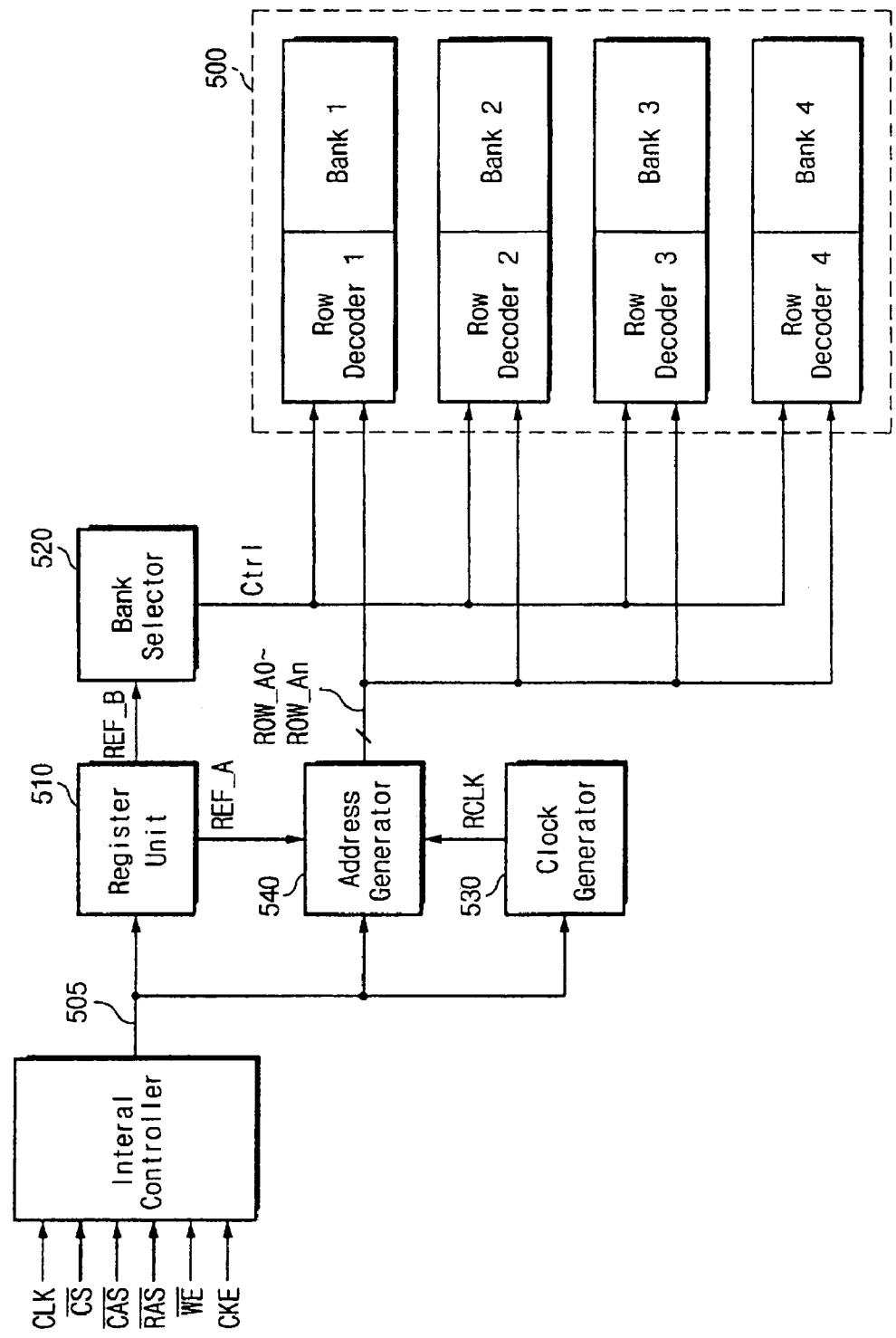
FIG. 5 is a block diagram showing an embodiment of the semiconductor memory device for performing the refresh operation of the first refresh mode.

FIG. 5 is a block diagram showing an embodiment of the semiconductor memory device for performing a refresh operation, for example a refresh operation of a first refresh mode as described above. Comparing FIG. 3 with FIG. 5, the semiconductor memory device operated by only first refresh mode as shown in FIG. 5 may operate without a switching unit. For example, if the refresh operation is initialized in the bank selector 520, the row decoders of all banks become enabled without conditions. Additionally, the address generator 540 may generate applicable row addresses ROW_A0~ROW_An according to refresh block information and then input them to the row decoders. Otherwise, the refresh operation and elements of FIG. 5 are similar to the semiconductor device explained above.

As previously mentioned, the semiconductor memory device having a selectable refresh mode can improve data processing speed and memory performance in general.

The above detailed description is for example purposes only and does not limit the scope of the invention. Therefore, the terms used in the following claims do not limit the invention to the specific embodiments disclosed herein, but should be construed to include all methods and devices that are in accordance with the claims. Accordingly, the following claims determine the scope of the invention.

What is claimed is:

1. A semiconductor memory device, comprising:
   a plurality of banks, each bank including a plurality of blocks; and
   a refresh controller coupled with the plurality of banks, the refresh controller to select between a first refresh mode that selects blocks to be refreshed from each bank and a second refresh mode that selects banks to be refreshed from the plurality of banks, wherein the refresh controller comprises:
   a register unit to store refresh information requested by a refresh operation;
   a clock generator to generate a sync clock according to a refresh command;
   an address generator to sequentially generate predetermined row addresses in response to the sync clock when the refresh command is input and to respectively input the generated row addresses to a row decoder connected to the banks;
   a bank selector to control the row decoders according to the refresh information; and
   a switching unit to input the refresh information to at least one of the address generator and the bank selector according to the refresh information.

2. The semiconductor memory device of claim 1, wherein refresh information is equivalent to refresh bank information, refresh block information and refresh mode information.

3. The semiconductor memory device of claim 2, wherein the refresh bank information and the refresh block information are represented as a predetermined address.

4. The semiconductor memory device of claim 2, wherein the refresh mode information is embodied in a mode register set (MRS) or a fuse option.

5. The semiconductor memory device of claim 1, wherein the switching unit can input refresh block information to the address generator and refresh bank information to the bank selector in the first refresh mode.

6. The semiconductor memory device of claim 5, wherein the bank selector may enable all row decoders connected to the banks.

7. The semiconductor memory device of claim 5, wherein the address generator may sequentially generate only row addresses of an applicable block according to the refresh block information.

8. The semiconductor memory device of claim 1, wherein the switching unit inputs only refresh bank information to the bank selector in the second refresh mode.

9. The semiconductor memory device of claim 8, wherein the bank selector may enable one of the row decoders connected to the bank according to the refresh bank information.

10. The semiconductor memory device of claim 8, wherein the address generator may sequentially generate all row addresses of the bank.

11. The semiconductor memory device of claim 1, wherein:
   the switching unit is configured to input the refresh information to the address generator and the bank selector according to the refresh information.

12. The semiconductor memory device of claim 1, wherein the switching unit is to input the refresh information to the address generator in the first refresh mode.

13. A semiconductor memory device, comprising:
   a plurality of banks, each bank including a plurality of blocks; and
   a refresh controller to respectively select a specific block from each of the plurality of banks to operate the refresh operation, wherein the refresh controller comprises:
   a register unit to store refresh block information for a refresh operation;
   a clock generator to generate a sync clock according to a refresh command; and
   an address generator to sequentially generate row addresses in response to refresh block information and the sync clock when the refresh command is input and to input the generated row addresses to a row decoder connected to the banks.

14. The semiconductor memory device of claim 13, wherein the address generator may generate only row addresses equivalent to the refresh block information.

15. A method comprising:
   providing refresh information from a register unit to a switching unit;
   providing at least a first portion of the refresh information from the switching unit to a bank selector;
   selectively providing at least a second portion of the refresh information from the switching unit to an address generator in response to the refresh information; and
   refreshing the semiconductor memory device in response to the bank selector and the address generator.

16. The method of claim 15, wherein
   selectively providing the at least the second portion of the refresh information further comprises providing the at least the second portion of the refresh information from the switching unit to an address generator in a first mode; and
   further comprising generating a plurality of addresses in the address generator in response to the at least the second portion of the refresh information, the plurality of address corresponding to a plurality of blocks in multiple banks.

17. The method of claim 15, wherein
   selectively providing the at least the second portion of the refresh information further comprises not providing the at least the second portion of the refresh information from the switching unit to an address generator in a second mode.

18. A semiconductor memory device comprising:
   a plurality of banks, each bank including a plurality of blocks; and
   a refresh controller coupled with the plurality of banks, the refresh controller to select between a first refresh mode that selects blocks to be refreshed from each bank and a second refresh mode that selects banks to be refreshed from the plurality of banks, the refresh controller including:
   a register unit to store refresh information requested by a refresh operation;
   a clock generator to generate a sync clock according to a refresh command;
   an address generator to sequentially generate predetermined row addresses in response to the sync clock when the refresh command is input and to respectively input the generated row addresses to a row decoder connected to the banks;
   a bank selector to control the row decoders according to the refresh information; and
   a switching unit to input the refresh information to at least one of the address generator and the bank selector according to the refresh information;

wherein the refresh information is equivalent to refresh bank information, refresh block information and refresh mode information.

19. The semiconductor memory device of claim 18, wherein the refresh bank information and the refresh block information are represented as a predetermined address.

20. The semiconductor memory device of claim 18, wherein the refresh mode information is embodied in a mode register set (MRS) or a fuse option.

21. The method of claim 15, wherein:
   the first portion of the refresh information is refresh bank information from the refresh information;
   the second portion of the refresh information is refresh block information from the refresh information; and
   selectively providing the at least the second portion of the refresh information from the switching unit to the address generator in response to the refresh information comprises selectively providing the at least the second portion of the refresh information from the switching unit to the address generator in response to refresh mode information from the refresh information.

* * * * *